United States Patent [19]

Iravani et al.

[11] Patent Number: 5,973,573
[45] Date of Patent: Oct. 26, 1999

[54] VCO CIRCUIT HAVING LOW GAIN VARIATION OVER DIFFERENT PROCESSES AND OPERATING TEMPERATURES AND HAVING LOW POWER SUPPLY NOISE SENSITIVITY

[75] Inventors: Kamran Iravani, San Jose, Calif.; Gary Miller, Corbett, Oreg.

[73] Assignee: VLSI Technology, Inc., San Jose, Calif.

[21] Appl. No.: 08/972,838

[22] Filed: Nov. 18, 1997

[51] Int. Cl.$^6$ .................... H03B 5/24; H03B 5/04
[52] U.S. Cl. ............... 331/57; 331/34; 331/176; 331/177 R; 331/186
[58] Field of Search ................. 331/34, 57, 175, 331/176, 177 R, 186; 327/274, 280, 287

[56] References Cited

U.S. PATENT DOCUMENTS

| | | | |
|---|---|---|---|
| 5,467,060 | 11/1995 | Miyashita | 331/74 |
| 5,523,723 | 6/1996 | Arcus et al. | 331/17 |
| 5,563,553 | 10/1996 | Jackson | 331/57 |
| 5,581,216 | 12/1996 | Ruetz | 331/57 |
| 5,635,878 | 6/1997 | Liu et al. | 331/57 |
| 5,748,048 | 5/1998 | Moyal | 331/34 |
| 5,821,823 | 10/1998 | Bereza | 331/57 |
| 5,847,616 | 12/1998 | Ng et al. | 331/57 |

*Primary Examiner*—David Mis
*Attorney, Agent, or Firm*—Wagner Murabito & Hao LLP

[57] ABSTRACT

A voltage controlled oscillator (VCO) circuit having low sensitivity to fabrication process variation, operating temperature variation, and power supply noise. The circuit of the present invention includes a current source controller, a bias circuit, and a first and second VCO cell. The first and second VCO cells are coupled to each other and are coupled to the bias circuit. The VCO circuit of the present invention also includes a VCO output for transmitting a VCO output signal to external electronics. A bias circuit current source is coupled to the bias circuit to transmit a bias circuit current from a power supply to the bias circuit. A first current source is coupled to the first VCO cell to transmit a first current from the power supply to the first VCO cell. A second current source coupled to the second VCO cell to transmit a second current from the power supply to the second VCO cell. The bias circuit current source, the first current source, and the second current source are each coupled to the current source controller to increase the power supply rejection ratio of the VCO circuit of the present invention. The first VCO cell and the second VCO cell each have respective first and second load transistors coupled to receive a bias compensation signal from the bias circuit such that the VCO output signal is less affected by changes in temperature and by fabrication process variation.

16 Claims, 6 Drawing Sheets

400

500

```
600
```

┌─────────────────────────────────┐
│ Receive a power supply voltage in │
│ a plurality of current sources   │
│                              601 │
└─────────────────────────────────┘
              ↓
┌─────────────────────────────────┐
│ Adjust for noise on the power   │
│ supply voltage using a current  │
│ source controller               │
│                             602 │
└─────────────────────────────────┘
              ↓
┌─────────────────────────────────┐
│    Receive a control voltage    │
│                             603 │
└─────────────────────────────────┘
              ↓
┌─────────────────────────────────┐
│ Generate an oscillating output  │
│ signal corresponding to the     │
│ control voltage                 │
│                             604 │
└─────────────────────────────────┘
              ↓
┌─────────────────────────────────┐
│ Generate a bias compensation    │
│ signal using a bias circuit     │
│                             605 │
└─────────────────────────────────┘
              ↓
┌─────────────────────────────────┐
│ Couple the bias compensation    │
│ signal to each VCO cell         │
│                             606 │
└─────────────────────────────────┘
              ↓
┌─────────────────────────────────┐
│    Maintain a constant and      │
│    stable output signal         │
│                             607 │
└─────────────────────────────────┘

FIG. 6

VCO CIRCUIT HAVING LOW GAIN VARIATION OVER DIFFERENT PROCESSES AND OPERATING TEMPERATURES AND HAVING LOW POWER SUPPLY NOISE SENSITIVITY

TECHNICAL FIELD

The present invention relates to the field voltage controlled oscillators. More particularly, the present invention relates to a voltage controlled oscillator (VCO) having a low sensitivity to noise on its power supply.

BACKGROUND ART

Voltage controlled oscillators (VCOs) are well known and widely used in the electronics industry Within the digital communications field, VCOs are used in a variety of applications. Such applications include, for example, frequency synthesizers, signal generation, (e.g., serial transmission clock recovery) and the like. VCOs are typically designed to perform within a given set of boundary conditions and to perform to a specified standard. Typical conditions include, for example, performance over operating temperature ranges, sensitivity to vibration, output sensitivity to interference, and the like. Typical performance standards include, for example, output signal frequency stability, output signal programmability, and the like.

A typical prior art VCO generates an oscillating output signal having a specified frequency. The signal can have several different wave forms (e.g., square, saw tooth, triangular, etc.). The frequency of the output is tunable and is a function of an input voltage, an external resistance or capacitance, or the like. The type of application in which the VCO is used dictates its operating conditions and performance requirements. However, as in most VCO applications, it is usually important that the output frequency of the VCO is stable and is a consistent function of the control inputs (e.g., voltage, capacitance, and the like). The output frequency should also be stable with respect to the different process corners of the fabrication process used to manufacture the VCO and should be constant over different operating temperatures.

For example in a case where a prior art VCO is used in an application for clock recovery in a serial transmission system, it is important that the output frequency remain stable and constant. The output frequency is used to reconstruct a serial transmission clock signal, which in turn, is used to sample data on a serial transmission line. Distortion or variation in the VCO output frequency, and hence, the reconstructed clock signal, can lead to sampling errors, lost data, decreased throughput, or other such problems. Consequently, for these applications it is important that the VCO provide a very stable, noise free output signal having a controlled frequency.

One problem prior art VCOs need to contend with is power supply noise. Noise, especially low frequency noise, in the power supply can have a detrimental effect on the VCO's output stability. As a typical VCO draws current from a power supply, the low frequency noise with this current (or voltage), or noise from other external devices (e.g., electromagnetic interference), can affect the output frequency. Such noise typically manifests itself as jitter on the rising and falling edges of the output signal, frequency skew in the output signal, or other distortions in the fidelity of the output.

Power supplies for VCOs are carefully filtered to remove this problematic noise. While higher frequencies are somewhat easier to remove, low frequency noise has proven more difficult and more expensive (e.g., with respect to silicon area or circuit board space) to remove. In addition, in most VCOs, a large portion of their circuitry is devoted to power supply noise rejection in order to enhance the stability of the output. These solutions are partially effective, however, as applications have become more complex and as noise sensitivity has increased with increasing levels of integration, power supply noise, particularly low frequency power supply noise, remains problematic.

Another problem is the effect of differing manufacturing process "corners". Each manufactured VCO is processed in fabrication facility and is subject to the particular variables of the specific manufacturing process employed. These variables are tightly controlled in an effort to make the devices which emerge from the process as uniform as possible. However, even the most closely monitored, tightly controlled, fabrication process has some variation, from lot to lot, of the process variables. This variation leads to slight performance variation within "families" of fabricated devices. The limits of this variation are referred to in the industry as process "corners". Hence, each nominal device emerging from fabrication will have some statistical performance variation within the process corners. At times, this variation is large enough to limit the applications to which a particular device is suited. In more severe cases, the variation can intermittently disrupt a system which includes the particular device.

Another problem is the temperature dependent variation in the output frequency of prior art VCOs. Typical prior art VCOs have difficulty maintaining a stable, constant output frequency as their operating temperatures change. When temperature increases or decreases, their output frequencies tend to increase or decrease correspondingly. This frequency variation can have a detrimental effect on the application in which the VCO is used.

Thus, what is required is a circuit which solves the power supply noise problems associated with the prior art. What is required is a circuit which is not adversely affected by low frequency noise in the power supply and which exhibits higher power supply noise rejection. What is required is a circuit which maintains a more constant, non-varying output frequency over differing operating temperatures, in comparison to the prior art. In addition, what is required is a circuit which maintains a constant and stable output frequency across the process corners. The present invention provides a novel solution to the above requirements.

DISCLOSURE OF THE INVENTION

The present invention provides a VCO circuit which solves the power supply noise problems associated with the prior art. The VCO circuit of the present invention is less affected by noise in the power supply and exhibits higher power supply noise rejection in comparison to the prior art. The VCO circuit of the present invention maintains a more constant, non-varying output frequency over differing operating temperatures, in comparison to the prior art. In addition, the present invention maintains a constant and stable output frequency across the process corners.

In one embodiment, the present invention comprises a voltage controlled oscillator (VCO) circuit having low sensitivity to fabrication process variation, operating temperature variation, and power supply noise. The circuit of the present invention includes a current source controller, a bias circuit, a first VCO cell, and a second VCO cell. The first and second VCO cells are coupled to each other and are coupled to the bias circuit. The VCO circuit of the present invention also includes a VCO output for transmitting a VCO output signal to external electronics. A bias circuit current source is coupled to the bias circuit to transmit a bias circuit current from a power supply to the bias circuit. A first current source is coupled to the first VCO cell to transmit a first current from the power supply to the first VCO cell. A second current source is coupled to the second VCO cell to transmit a second current from the power supply to the second VCO cell. The bias circuit current source, the first current source, and the second current source are each coupled to the current source controller to increase the power supply rejection ratio of the VCO circuit of the present invention. The first VCO cell and the second VCO cell each have respective first and second load transistors coupled to receive a bias compensation signal from the bias circuit such that the VCO output signal is less affected by changes in temperature and by fabrication process variation.

BRIEF DESCRIPTION OF THE DRAWINGS

The accompanying drawings, which are incorporated in and form a part of this specification, illustrate embodiments of the invention and, together with the description, serve to explain the principle of the invention:

FIG. 6 shows a flow chart of the steps of a process in accordance with one embodiment of the present invention.

BEST MODE FOR CARRYING OUT THE INVENTION

Reference will now be made in detail to the preferred embodiments of the invention, a VCO circuit having low gain variation over different process corners and operating temperatures and having low power supply noise sensitivity, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention comprises a VCO circuit which solves the power supply noise problems associated with the prior art. The VCO circuit of the present invention is less affected by noise in the power supply and exhibits higher power supply noise rejection in comparison to the prior art. The VCO circuit of the present invention maintains a more constant, non-varying output frequency over differing operating temperatures, in comparison to the prior art. In addition, the present invention maintains a constant and stable output frequency across the process corners. The present invention and its benefits are further described below.

Figure 1:
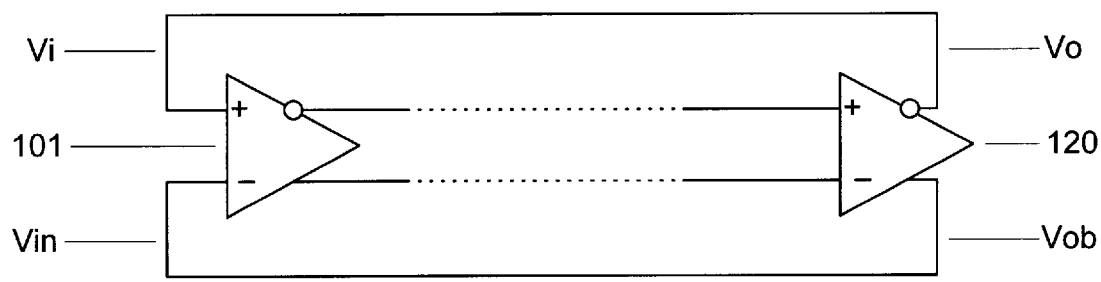
FIG. 1 shows a schematic block diagram of a VCO in accordance with one embodiment of the present invention.

FIG. 1 shows a schematic block diagram of a VCO circuit 100 in accordance with one embodiment of the present invention. VCO circuit 100 illustrates the general scheme of operation of the present invention. VCO circuit 100 is comprised of a plurality of inverters coupled to form a "chain" where the output of the first inverter is coupled to the input of the second inverter, and so on throughout the chain. Each inverter has a positive and a negative input and a corresponding positive and negative output. The first inverter, e.g., inverter 101 of VCO circuit 100 has its outputs coupled to the inputs of the next inverter, and so on, until the last inverter 120 in the chain is coupled. The plurality of inverters between inverter 101 and 120 are represented by dotted lines. The outputs of the last inverter 120 are coupled to the inputs of the first inverter 101.

The resulting feed back effects an oscillation within VCO circuit 100. The number of inverters included in VCO circuit 100 largely determines the resulting natural frequency of oscillation and the total gain. The frequency of oscillation is variable over a range. The degree of variation is determined by the application of a control voltage to the circuitry comprising each inverter. Feedback to the inputs Vi and $Vi_n$ from the outputs Vo and $Vo_b$ sustain the oscillation. The output signal of VCO circuit 100 is typically taken from the outputs Vo and Vob of the last inverter, inverter 120. VCO circuit 100 functions by maintaining a stable, predictable, output signal at Vo and $Vo_b$ having a frequency which corresponds to an externally applied control voltage (VCOin, shown in FIG. 2). The frequencies at Vo and $Vo_b$ are substantially the same except for being opposite in phase. The present invention functions by ensuring the output signal taken from Vo and Vob remains stable and substantially unaffected by noise on a power supply for the inverters 101–120, and by ensuring the output signal remains constant and stable across the process corners and varying operating temperatures.

Figure 2:
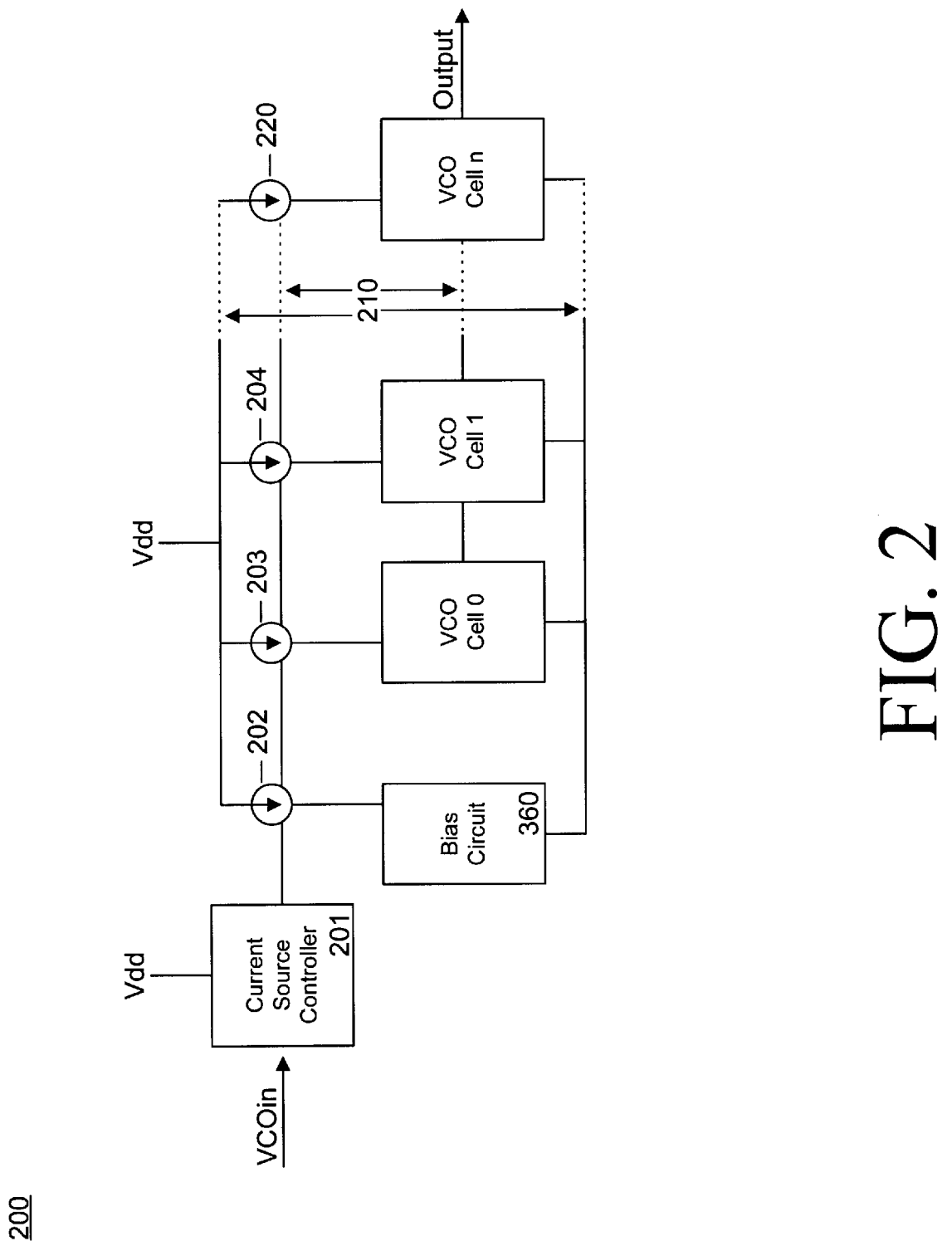
FIG. 2 shows a more detailed block diagram of another VCO in accordance with another embodiment of the present invention.

Referring now to FIG. 2, a more detailed block diagram of a VCO circuit 200 in accordance with present invention is shown. VCO circuit 200 includes a plurality of VCO cells coupled in a chain, in the same manner as inverters 101–120 of VCO circuit 100. The first VCO cell, VCO cell 0, is coupled to VCO cell 1, and so on, through the last VCO cell in the chain, VCO cell n. The plurality of VCO cells (not shown) between VCO cell 1 and VCO cell n are similarly coupled via dotted lines 210 for clarity. As with the number of inverters in VCO circuit 100, the number of VCO cells in VCO circuit 200 largely determines the resulting natural frequency of oscillation and the total gain of VCO circuit 200. And, similarly to the outputs of VCO circuit 100, the output of VCO circuit 200 taken from the VCO cell coupled furthest from the control voltage input (e.g., VCO cell n). It should be appreciated, however, that the outputs of VCO circuit 200 can be taken from any one of the VCO cells in the chain. Alternatively, several VCO cells, or even all VCO cells, of VCO circuit 200 can be coupled to provide suitable output, depending upon the particular requirements of an application.

VCO circuit 200, in accordance with the present embodiment, includes a current source controller 201 and a bias circuit 360. The output of the current source controller 201 is coupled to each of current sources 202, 203, 204, and so on, through to source follow transistor 220 (e.g., where each of VCO cells 0 through n have a respective corresponding current source). Each of the current sources 202–220 have their respective inputs coupled to Vdd (e.g., 3.3v power supply) and their respective outputs coupled to their respective VCO cells, except in the case of current source 202, where a bias circuit 360 is coupled, as opposed to a VCO cell. The current source controller 201 functions by adjusting each of the current sources to increase their effective power supply rejection ratio, lowering the sensitivity of VCO circuit 200 to noise on Vdd. The bias circuit 360 is designed to match the current and voltage characteristics a typical VCO cell (e.g., VCO cell 0). The bias circuit 360 is coupled to VCO cell 0 as if it where a typical VCO cell. The bias circuit 360 functions by providing a bias compensation signal to each of the VCO cells. The bias compensation signal functions by adjusting each of the VCO cells such that the output signal remains substantially constant across temperature variations and across process corners.

The bias circuit 360 of FIG. 2 is designed and fabricated to match the current and voltage characteristics of each of the VCO cells 0 through n. Consequently, the bias compensation signal from the bias circuit 360 causes matching corresponding corrections for each VCO cell to counteract the effects of variation due to the process corners. For example, where a normal process variation affects the electrical characteristics of the VCO cells, the same process variation affects the electrical characteristics of the bias circuit 360. In so doing, the bias compensation signal is similarly affected, which in turn, causes a counteracting correction in the VCO cells. This reduces the effect of the normal variation across the process corners.

In addition, the bias compensation signal varies in response to temperature to correct temperature based performance variations in the VCO cells. For example, as the VCO cells 0 through n oscillate, they draw current from Vdd via current sources 203–220. As the operating temperature of VCO circuit 200 increases, electron mobility decreases, VCO circuit 200 "slows down", and the output frequency tends to decrease. The bias compensation signal, however, changes in response to changing operating temperature in such a way as to counteract the tendency of VCO circuit 200 to slow down. The bias compensation signal causes an increase or decrease in the amount of current drawn by the VCO cells of VCO circuit 200 in order to compensate for the effects on the VCO output. This allows VCO circuit 200 to maintain a substantially stable and constant output frequency even as the temperature environment (e.g., the operating temperature) changes.

Figure 3A:
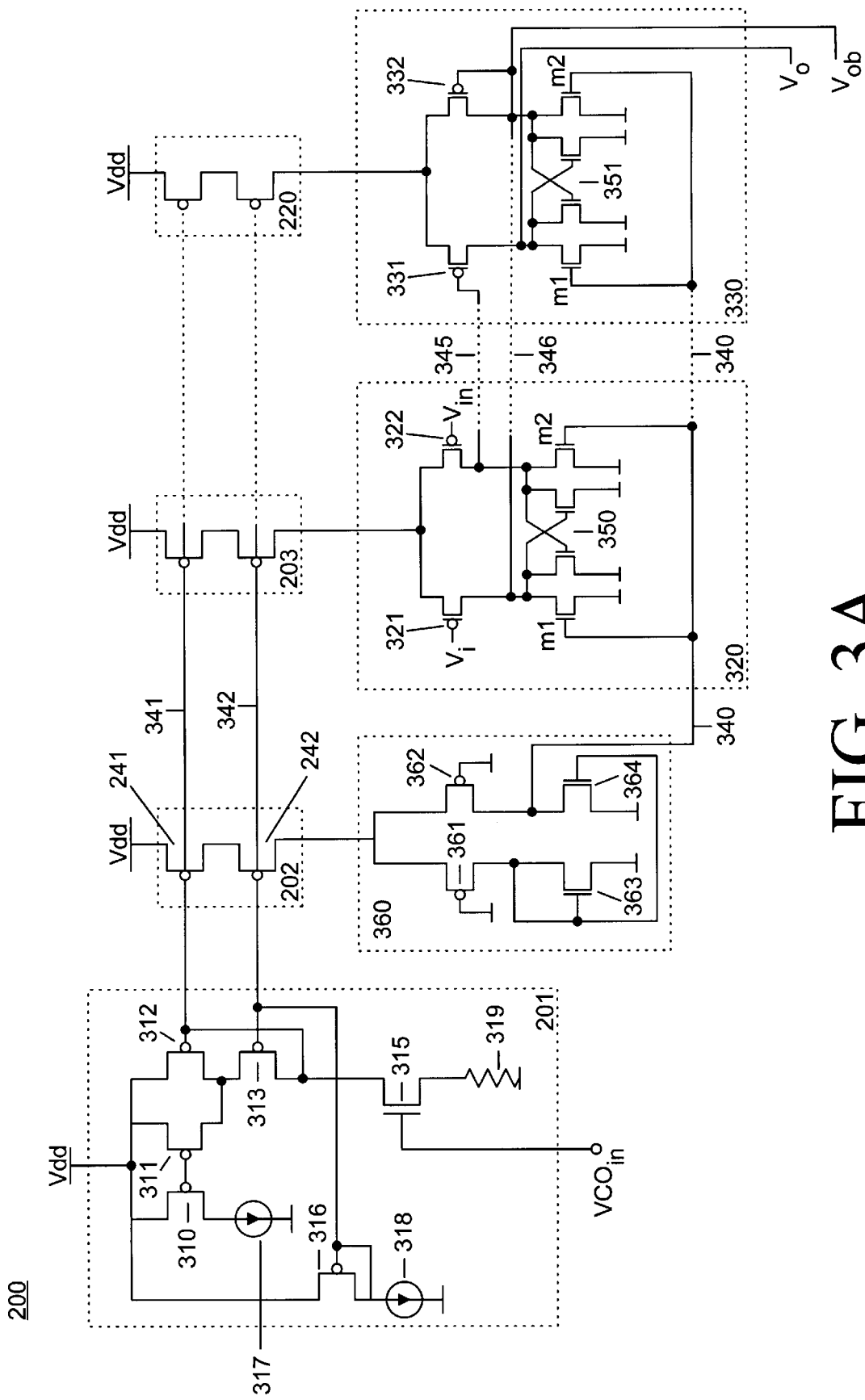
FIG. 3A shows a circuit diagram of the components of the VCO from FIG. 2.

FIG. 3A shows a circuit diagram of VCO circuit 200. Bias circuit 360 corresponds to the bias circuit from FIG. 2, VCO cell 320 corresponds to VCO cell 0, and VCO cell 330 corresponds to VCO cell n. VCO cell 320 includes a transistor 321 and a transistor 322, both coupled to Vdd through current source 203. Voltage inputs Vi and $Vi_n$ are respectively coupled to transistors 321–322. A load transistor m1 and a load transistor m2 are respectively coupled between transistors 321–322 and line 340. Transistors m1 and m2 are also coupled to cross-connected transistors 350. VCO cell 330 is similarly constructed, including transistors 331 and 332, respective load transistors m1 and m2, and cross-connected transistors 351. VCO cell 330 also includes an output Vo and Vob.

As described above, a plurality of VCO cells (and their corresponding current sources) are coupled between VCO cell 320 and VCO cell 330, along lines 341, 342, 345, 346, and 340. Each of the plurality of VCO cells are coupled to lines 341, 342, 345, 346, and 340 in a manner similar to VCO cell 330, as represented by the dashed portions of lines 341, 342, 345, 346, and 340.

Bias circuit 360 of FIG. 3A includes transistors 361–364. Transistors 361 and 362 are coupled to Vdd via current source 202. The gates of transistors 363 and 364 are coupled to the node between transistors 361 and 363. The sources of transistors 363–364 are coupled to ground. Line 340 is coupled to the node between transistors 362 and 364. This node provides the bias compensation signal. Line 340 couples the bias compensation signal to each VCO cell in VCO circuit 200.

As described above, bias circuit 360 is designed and fabricated to match the current and voltage characteristics of each of the VCO cells 320 through 330. Consequently, the bias compensation signal transmitted via line 340 from the bias circuit 360 causes matching corresponding corrections for each VCO cell to counteract the effects of variation due to the process corners. The bias compensation signal (e.g., on line 340) also varies in response to temperature to correct temperature based performance variations in the VCO cells. The bias compensation signal causes an increase or decrease in the amount of current drawn by the VCO cells of VCO circuit 200 in order to effect a compensation in the VCO output. This allows VCO circuit 200 to maintain a substantially stable and constant output frequency even as the temperature environment (e.g., the operating temperature) changes.

Referring still to FIG. 3A, in the present embodiment, each VCO cell, for example, VCO cell 320, functions as a differential inverter having p-channel inputs (e.g., Vi and Vin) and n-channel loads (e.g., m1 and m2). The voltage on line 340 is applied to the gates of the n-channel loads and the cross connected transistors 350 are used to increase gain. Line 340 couples the bias compensation signal to the gates of the load transistors of each VCO cell. Hence, the bias compensation signal, in part, controls the amount of current flowing through the load transistors, which in turn, adjusts their frequency of oscillation. This allows the bias compensation signal to alter the current flowing through each VCO cell in response to the process corners and the particular operating temperature. VCO circuit 200 uses each of current sources 202–220, in conjunction with current source controller 201, to isolate VCO cells 320–330 from Vdd noise. Within each VCO circuit (e.g., VCO circuit 320), where the voltage at the node between transistors 321 and 322 and current source 203 is isolated and independent of Vdd, the power supply rejection ratio of VCO circuit 200 is ideal. In the present embodiment, the voltage at this node is isolated from Vdd by current source 203. By effecting a high impedance within current source 203, changes in Vdd have little effect on the frequency of oscillation of VCO circuit 200. Current source controller 201 controls each of the current sources 202–220 to maximize the power supply rejection ratio of VCO circuit 200.

In the present embodiment, each current source (e.g., current source 202) is comprised of two p-channel transistors (e.g., transistor 241 and transistor 242). The gates of transistors 241 and 242 are coupled to lines 341 and 342. Current source controller 201 controls the voltage on lines 341 and 342 to adjust for changes in Vdd such that a substantially constant current flows from Vdd to each of VCO cells 320–330 and bias circuit 360. In so doing, the action of current source controller 201 substantially increases the effective impedance of current sources 202–220, and thus, increases the power supply rejection ratio of VCO circuit 200.

Current source controller 201 of FIG. 3A includes transistors 310–316, current sources 317 and 318, and resistor 319. As described above, current source controller 201 functions by controlling the voltage on lines 341 and 342. The voltage on lines 341 and 342 is varied in response to changes in VCOin, in addition to noise on Vdd. This causes current sources 202–220 to flow more or less current in response to VCOin, which in turn, increases or decreases the frequency of the VCO output signal.

Figure 3B:
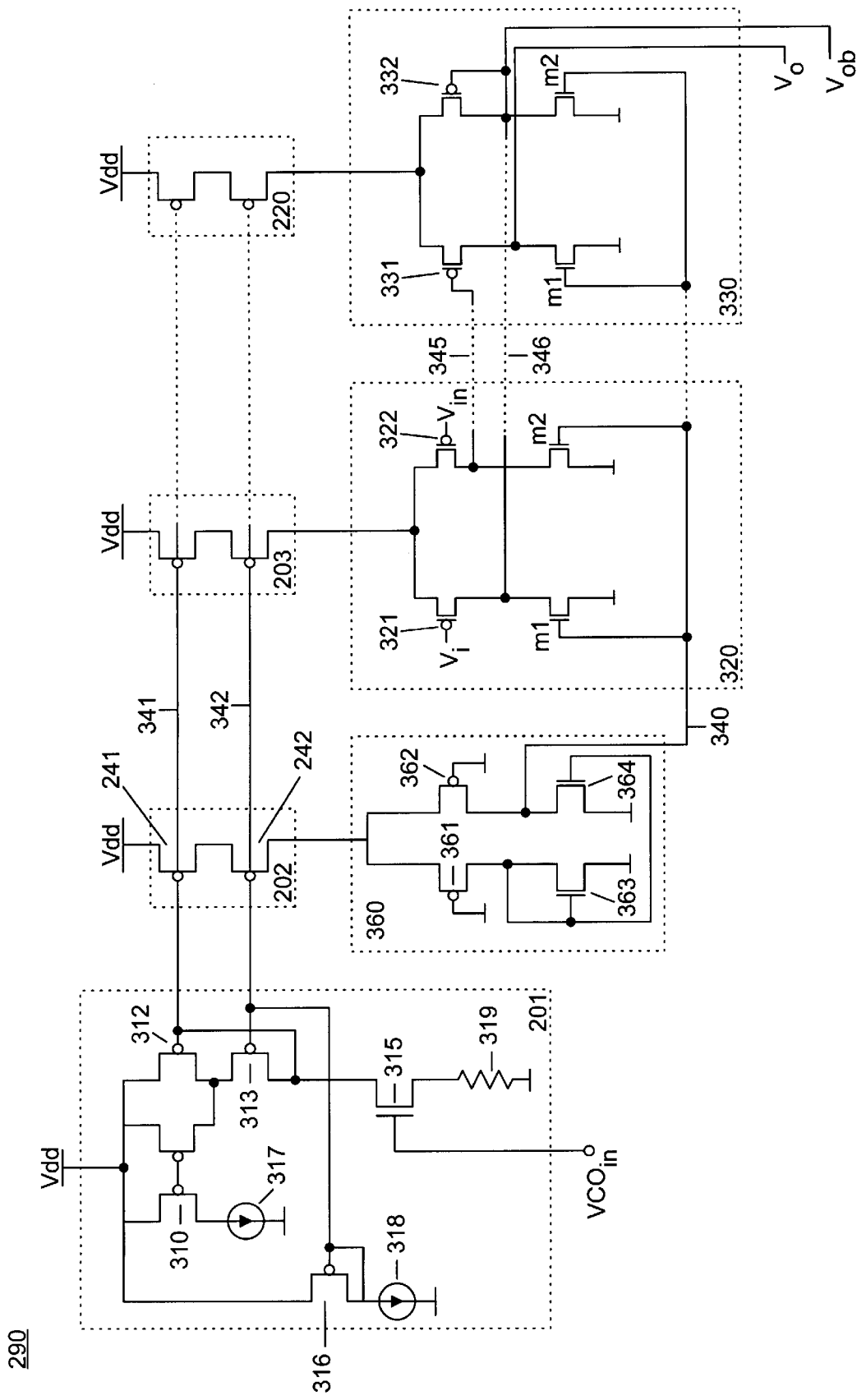
FIG. 3B shows a circuit diagram of the components of an alternative embodiment of the VCO from FIG. 2.

FIG. 3B shows a VCO circuit 290 in accordance with an alternate embodiment of the present invention. VCO circuit 290 is similar to VCO circuit 200 except that the cross coupled transistors in each VCO cell (e.g., cross coupled transistors 350 and 351) are eliminated. This reduces the number of transistors included in VCO circuit 290 and reduces the gain. In other respects, VCO circuit 290 functions similarly to VCO circuit 200.

Figure 4:
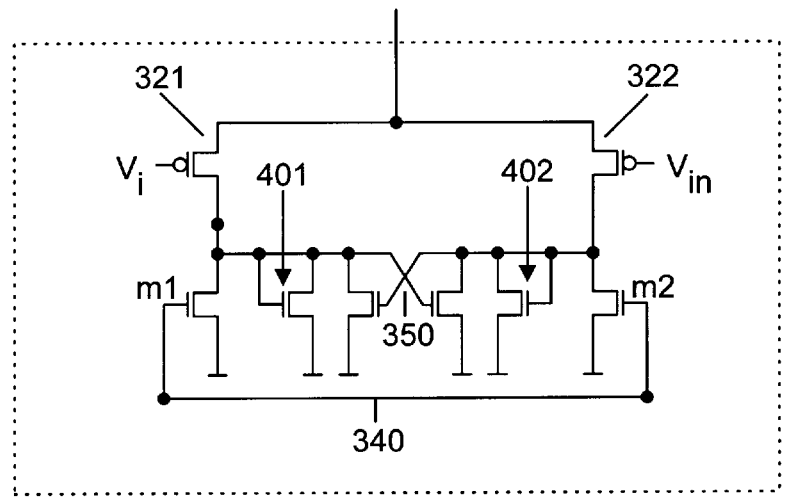
FIG. 4 shows a VCO cell in accordance with an alternate embodiment of the present invention.

Referring now to FIG. 4, a VCO cell 400 in accordance with an alternate embodiment of the present invention is shown. VCO cell 400 is similar to, and is included within VCO circuit 200 in a manner similar to VCO cell 320. However, VCO cell 400 includes a diode coupled transistor 401 and a diode coupled transistor 402. Transistors 401 and 402 function by limiting the voltage swing as VCO cell 400 oscillates. Transistors 401 and 402 limit the amplitude of the VCO output signal. In so doing, they increase the speed at which the load transistors oscillate, increasing the frequency of the VCO output signal.

Figure 5:
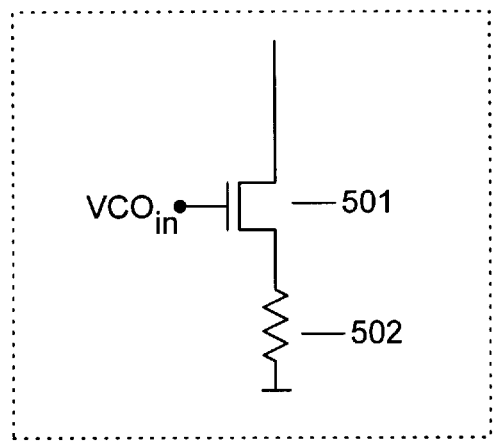
FIG. 5 shows a current source included in the current source controller from FIG. 3A in accordance with one embodiment of the present invention.

FIG. 5 shows a current source 500 in accordance with one embodiment of the present invention in greater detail. Current source 500 corresponds to either current source 317 or current source 318 of current source controller 201. Current source 500 is comprised of a transistor 501 coupled to receive VCOin and a resistor 502 coupling the source of transistor 501 to ground. The proper current flow (e.g., to tailor the characteristics of current source controller 201) through current source 500 is obtained by properly selecting the value of resistor 502.

FIG. 6 shows a flow chart of the steps of a process 600 in accordance with one embodiment of the present invention. Process 600 begins in step 601, where a VCO circuit (e.g., VCO circuit 200 from FIG. 3A) receives a power supply voltage Vdd. VCO circuit 200 is coupled to Vdd via a plurality of included current sources (e.g., current sources 202–220). The current from Vdd sets up an internal oscillation.

In step 602, a current source controller (e.g., current source controller 201) coupled to each of the current sources 202–220 adjusts for noise on the power supply voltage. The current source controller 201 adjusts the current flowing through each of the current sources 202–220 to compensate for changes (e.g., noise) on Vdd. In so doing, each of the current sources 202–220 transmit a substantially constant, noise free current to their respective VCO cells.

In step 603, the current source controller 201 receives a control voltage (e.g., VCOin). In the present embodiment, the control voltage is received from external circuitry. The current source controller 201 adjusts the amount of current transmitted to each VCO cell based upon the control voltage. The current from each of the current sources 202–220, in turn, controls the frequency of oscillation.

In step 604, the VCO circuit of the present invention generates an oscillating output signal having a frequency corresponding to the control voltage. The oscillation described above is used to generate an oscillating output signal (e.g., Vo and Vob). In the present embodiment, the output signal is taken from one of the VCO cells in the VCO circuit (e.g., VCO cell 330). A first output, Vo, and a second output, Vob, are coupled to VCO cell 330 such that Vob is an inverted version of Vo (e.g., phase reversed).

In step 605, a bias circuit (e.g., bias circuit 360) generates a bias compensation signal (e.g., on line 340). As described above, the bias circuit 360 is designed to generate a bias compensation signal which adjusts the electrical characteristics of each VCO cell to maintain a substantially constant and stable output frequency across the process corners and across different operating temperatures.

In step 606 of FIG. 6, the bias compensation signal is coupled to each of the VCO cells. Each VCO cell includes a first and second load transistor (e.g., m1 and m2). The gates of the load transistors are coupled to receive the bias compensation signal.

In step 607, the VCO circuit of the present invention maintains a constant and stable output signal. The bias compensation signal adjusts the voltage at the gates of the load transistors such that the frequency of the output signal remains substantially stable across the process corners and remains substantially stable across different operating temperatures.

Thus, the present invention provides a VCO circuit which solves the power supply noise problems associated with the prior art. The embodiments of the VCO circuit of the present invention are less affected by noise in the power supply and exhibit higher power supply noise rejection in comparison to the prior art. The embodiments of the VCO circuit of the present invention maintain a more constant, non-varying output frequency over differing operating temperatures, in comparison to the prior art. In addition, the present invention maintains a constant and stable output frequency across the process corners.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A voltage controlled oscillator (VCO) circuit having low sensitivity to fabrication process variation, operating temperature variation, and power supply noise, comprising:

a current source controller;

a bias circuit;

a first VCO cell coupled to said bias circuit;

a second VCO cell coupled to said first VCO cell and said bias circuit;

a VCO output transmitting a VCO output signal;

a bias circuit current source coupled to supply a bias circuit current to said bias circuit;

a first current source coupled to said first VCO cell to supply a first current to said first VCO cell;

a second current source coupled to said second VCO cell to supply a second current to said second VCO cell, said bias circuit current source, said first current source, and said second current source coupled to said current source controller to increase the power supply rejection ratio of said voltage controlled oscillator circuit; and said first VCO cell and said second VCO cell having respective first and second cross coupled transistors operable to increase gain and respective first and second load transistors coupled to receive a bias compensation signal from said bias circuit such that said VCO output signal is resistant to changes in temperature and fabrication process variations.

2. The circuit of claim 1, further comprising:

first and second voltage inputs included in each of said first VCO cell and said second VCO cell;

first and second voltage outputs included in each of said first VCO cell and said second VCO cell;

said first and second voltage outputs of said first VCO cell respectively coupled to said first and second voltage inputs of said second VCO cell and said first and second voltage outputs of said second VCO cell respectively coupled to said first and second voltage inputs of said first VCO cell to sustain an oscillation within said VCO circuit.

3. The circuit of claim 1, wherein a VCO input is coupled to said current source controller to control the frequency of said VCO output signal.

4. The circuit of claim 1, wherein said current source controller is for adjusting the current flowing through said first current source and said second current source to increase the power supply rejection ratio of said voltage controlled oscillator circuit.

5. The circuit of claim 1, wherein said first current source and said second current source each comprise a plurality of cascode transistors.

6. The circuit of claim 1, wherein said first VCO cell and said second VCO cell each include a plurality of diode coupled transistors to limit the amplitude of said VCO output signal.

7. A voltage controlled oscillator (VCO) circuit having low sensitivity to fabrication process variation, operating temperature variation, and power supply noise, comprising:

a current source controller;

a bias circuit;

a first VCO cell coupled to said bias circuit;

a second VCO cell coupled to said first VCO cell and said bias circuit;

a VCO output for transmitting a VCO output signal;

a bias circuit current source coupled to supply a bias circuit current to said bias circuit;

a first current source coupled to said first VCO cell to transmit a first current to said first VCO cell;

a second current source coupled to said second VCO cell to transmit a second current to said second VCO cell, said bias circuit current source, said first current source, and said second current source coupled to said current source controller to increase the power supply rejection ratio of said voltage controlled oscillator circuit; wherein said current source controller adjusts the current flowing through said first current source and said second current source to increase the power supply rejection ratio of said voltage controlled oscillator circuit with respect to noise on a coupled power supply, and said first VCO cell and said second VCO cell having respective first and second cross coupled transistors operable to increase gain and respective first and second load transistors coupled to receive a bias compensation signal from said bias circuit, said bias compensation signal causing an increase or a decrease in an amount of current drawn by said first and second VCO cells such that said VCO output signal is less affected by changes in temperature and by fabrication process variation.

8. The circuit of claim 7, further comprising:

first and second voltage inputs included in each of said first VCO cell and said second VCO cell;

first and second voltage outputs included in each of said first VCO cell and said second VCO cell;

said first and second voltage outputs of said first VCO cell respectively coupled to said first and second voltage inputs of said second VCO cell and said first and second voltage outputs of said second VCO cell respectively coupled to said first and second voltage inputs of said first VCO cell to sustain an oscillation within said VCO circuit.

9. The circuit of claim 7, wherein a VCO input is coupled to said current source controller to control the frequency of said VCO output signal.

10. The circuit of claim 7, wherein said first current source and said second current source are each comprised of a plurality of cascode transistors.

11. The circuit of claim 7, wherein said first VCO cell and said second VCO cell each include a plurality of diode coupled transistors to limit the amplitude of said VCO output signal.

12. In a voltage controlled oscillator (VCO) circuit including a bias circuit and a current source controller coupled to a plurality of VCO cells, a method of maintaining a constant and stable VCO output signal across process corners and different operating temperatures, the method comprising the steps of:

a) receiving a power supply voltage in said VCO circuit from a coupled power supply;

b) adjusting for noise on said power supply using said current source controller;

c) generating an oscillating VCO output signal responsive to said control voltage input received at said current source controller;

d) generating a bias compensation signal using said bias circuit;

e) supplying said bias compensation signal to a plurality of VCO cells;

f) using said bias compensation signal to maintain a constant frequency in said VCO output signal as operating temperature changes, said bias compensation signal causing an increase or a decrease in an amount of current drawn by said plurality of VCO cells corresponding to said temperature changes, said VCO cells including respective first and second cross coupled transistors operable to increase gain; and g) using said current source controller to reject noise on said power supply to maintain stability in said VCO output signal, wherein said step g) further includes the step of said current source controller adjusting the current flowing through a plurality of coupled current sources to increase the power supply rejection ratio of said voltage controlled oscillator circuit with respect to noise on a coupled power supply.

13. The method of claim 12, further including the step of increasing the power supply rejection ratio of said VCO circuit by adjusting the current flowing through a plurality of current sources respectively coupled to said plurality of VCO cells.

14. The method of claim 12, further comprising the step of receiving said bias compensation signal at the gates of a plurality of load transistors included in each of said plurality of VCO cells.

15. The method of claim 12, wherein step g) further includes the step of transmitting a substantially constant current to said plurality of VCO cells via said plurality of current sources regardless of noise on said power supply by controlling a plurality of current sources with said current source controller.

16. The method of claim 12, wherein step g) further includes the step of maintaining a substantially constant VCO output frequency regardless of changes the temperature of said VCO circuit by using said bias compensation signal to adjust the voltage at the respective gates of a plurality of load transistors included in each of said plurality of VCO cells.

\* \* \* \* \*